United States Patent
Chan

(10) Patent No.: US 10,367,495 B2
(45) Date of Patent: Jul. 30, 2019

(54) HALF-BRIDGE DRIVER CIRCUIT

(71) Applicant: Mosway Technologies Limited, Hong Kong (CN)

(72) Inventor: On Bon Peter Chan, Hong Kong (CN)

(73) Assignee: Mosway Technologies Limited, Hong Kong (CN)

(*) Notice: Subject to any disclaimer, the term of this patent is extended or adjusted under 35 U.S.C. 154(b) by 0 days.

(21) Appl. No.: 15/707,542

(22) Filed: Sep. 18, 2017

(65) Prior Publication Data

US 2018/0083612 A1  Mar. 22, 2018

Related U.S. Application Data

(60) Provisional application No. 62/396,371, filed on Sep. 19, 2016.

(51) Int. Cl.
| | | |
|---|---|---|
| H03K 3/00 | (2006.01) | |
| H03K 17/687 | (2006.01) | |
| H03L 5/00 | (2006.01) | |
| H03K 17/06 | (2006.01) | |
| H03K 3/012 | (2006.01) | |
| H03K 19/0944 | (2006.01) | |
| H03K 3/356 | (2006.01) | |
| H03K 17/16 | (2006.01) | |
| H02M 1/08 | (2006.01) | |

(52) U.S. Cl.
CPC ........... *H03K 17/063* (2013.01); *H03K 3/012* (2013.01); *H03K 3/35613* (2013.01); *H03K 17/162* (2013.01); *H03K 19/0944* (2013.01); *H02M 1/08* (2013.01); *H03K 2217/0063* (2013.01); *H03K 2217/0081* (2013.01)

(58) Field of Classification Search
CPC .. H03K 17/063; H03K 3/012; H03K 19/0944; H03K 2217/0081; H03K 2217/0063; H02M 1/08
See application file for complete search history.

(56) References Cited

U.S. PATENT DOCUMENTS

| | | | |
|---|---|---|---|
| 5,514,981 A | 5/1996 | Tam et al. | |
| 5,892,385 A * | 4/1999 | Hashiguchi | H03K 19/01855 326/68 |
| 6,002,270 A * | 12/1999 | Timoc | H03K 3/356113 326/115 |
| 6,586,974 B1 * | 7/2003 | Humphrey | H03K 19/00315 326/82 |
| 6,646,469 B2 * | 11/2003 | Yushan | H03K 17/063 326/68 |
| 6,940,262 B2 * | 9/2005 | Dequina | H02M 1/38 323/284 |
| 7,622,954 B2 * | 11/2009 | Illegems | H03K 3/356182 326/68 |
| 7,782,115 B2 * | 8/2010 | Ochi | H03F 3/2173 326/68 |

(Continued)

*Primary Examiner* — Kenneth B Wells
(74) *Attorney, Agent, or Firm* — Leydig, Voit & Mayer

(57) ABSTRACT

A circuit for controlling a high-side power switch includes a level shifting circuit including a latching circuit. The level shifting circuit is configured to receive a control signal for selectively configuring the latching circuit to be in a set state, for providing a first output signal to the high-side power switch, and in a reset state, for providing a second output signal, different from the first output signal, to the high-side power switch.

11 Claims, 6 Drawing Sheets

(56) References Cited

U.S. PATENT DOCUMENTS

| | | | | |
|---|---|---|---|---|
| 7,994,819 B2* | 8/2011 | Al-Shyoukh | ...... | H03K 3/35613 |
| | | | | 326/68 |
| 8,134,400 B2* | 3/2012 | Yamamoto | ........... | H03K 17/168 |
| | | | | 326/62 |
| 8,258,819 B2* | 9/2012 | Tripathi | ............... | H03K 5/2481 |
| | | | | 327/57 |
| 8,581,627 B2* | 11/2013 | Panov | ............ | H03K 19/018521 |
| | | | | 326/80 |
| 8,598,916 B2* | 12/2013 | Miller | ............ | H03K 19/018521 |
| | | | | 327/108 |
| 8,680,895 B2* | 3/2014 | Carpenter | ............. | H02M 3/158 |
| | | | | 318/34 |
| 9,294,093 B2* | 3/2016 | Akahane | .......... | H03K 3/356182 |
| 9,559,673 B2* | 1/2017 | Grubelich | ........ | H03K 3/356104 |
| 9,712,170 B2* | 7/2017 | Aipperspach | .. | H03K 19/018521 |
| 2009/0179235 A1* | 7/2009 | Shiraishi | ......... | H01L 21/823487 |
| | | | | 257/288 |

* cited by examiner

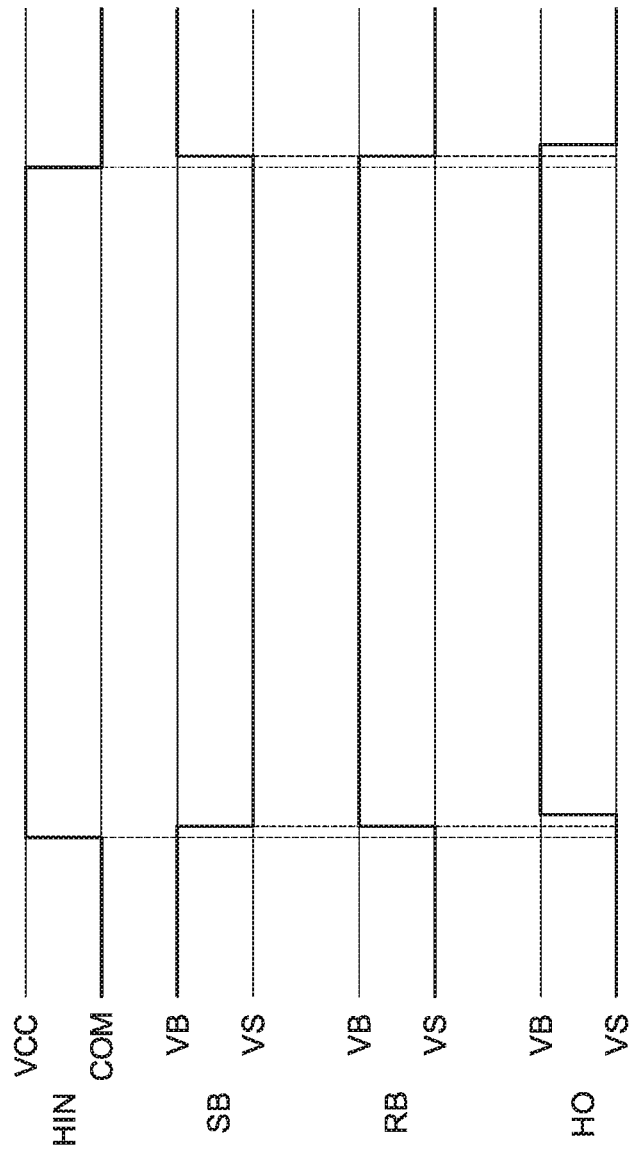

HALF-BRIDGE DRIVER CIRCUIT

TECHNICAL FIELD

The invention relates to a high-side power switch control circuit. More particularly, although not exclusively, the invention relates to a high-side power switch control circuit for a bridge driver or for a half-bridge driver.

BACKGROUND

FIG. 1 shows a conventional half-bridge driver circuit 100. The circuit 100 is arranged to receive a high-side input HIN and a low-side input LIN, for controlling a high-side output HO and a low-side output LO respectively. The low-side output LO can change between voltage levels COM and VCC. For example, the potential of COM may be at ground (0V) and the potential of VCC may be 20V. The high-side output HO can change between the floating voltage levels VS and VB, where |VB-VS| is the magnitude of the power supply for the high side circuit similar to |VCC-COM| is the magnitude of the power supply voltage for the low side circuit. VS is a floating voltage with reference to COM which can switch between a low voltage below COM and very high voltage above COM (e.g. 600V). The high-side output HO and the low-side output LO are each arranged to drive a respective power switch (not shown) which is further connected to a load. As shown in FIG. 1, the circuit 100 includes an input logic module arranged to receive the high-side input HIN and the low-side input LIN. The input logic module is connected with a low-side circuit providing the low-side output LO and a high-side circuit providing the high-side output HO.

The low-side circuit includes a first path with an undervoltage lockout (UVLO) module connected with VCC, and a second path with a delay module and a buffer module. A low-side driver module formed by two switches is connected across VCC and COM. More particularly, the buffer module is connected with the gate terminals of both switches. The drain terminals of the switches are connected to the low-side output LO.

The high-side circuit includes a pulse generator arranged to receive a signal processed by the input logic module. The pulse generator is connected with a level shifting circuit with two switches 101, 102 (e.g., high voltage LDMOS devices) at their gate terminals. Source terminals of the two switches 101, 102 are connected together and to COM. The drain terminal of one switch 101 is connected with a RB node that is connected with a pulse filter 105 and a $\overline{R}$ terminal of a RS latch 180. The drain terminal of the other switch 102 is connected with a SB node that is connected with the pulse filter 105 and a $\overline{S}$ terminal of the RS latch 180. The level shifting circuit also includes a resistor 170 arranged between the RB node and VB, and a resistor 172 arranged between the SB node and VB. A buffer module 106 and a high-side driver module with two switches 107, 108 are connected between the output $\overline{Q}$ of the RS latch 180 and the high-side output HO. The drain terminals of the switches 107, 108 are connected with the high-side output HO.

U.S. Pat. No. 5,514,981 discloses a driver circuit with a similar arrangement to that of FIG. 1.

FIG. 2 shows the waveforms at the high-side input HIN, the SB node, the RB node, and the high-side output HO. As shown in the Figure, during state change of the high-side output HO as the result of the state change of the high-side input HIN, common mode noise exists at both the RB and SB nodes due to capacitance at these nodes. In circuit configurations in which the two resistors 170, 172 are of the same resistance, and the two switching devices 101, 102 (e.g., high voltage laterally diffused metal oxide semiconductor (LDMOS) devices) in the level shifting circuit are of the same size, the common mode noise produced at the RB and SB nodes have substantially the same magnitude. Such common mode noises, if allowed to pass through the pulse filter 105, may potentially undesirably steer the RS latch 180 to the wrong state. In some applications, such latch on/latch off fault can burn or damage the power switches in the external half bridge device driven by the driver circuit. In some applications, even the integrated circuit itself can be burnt or damaged.

SUMMARY OF THE INVENTION

In accordance with a first aspect of the invention, there is provided a circuit for controlling a high-side power switch, comprising: a level shifting circuit comprising a latching circuit; the level shifting circuit being configured to receive a control signal for selectively configuring the latching circuit to be in a set state for providing a first output signal to the high-side power switch and in a reset state for providing a second output signal different from the first output signal to the high-side power switch. The latching circuit, integrated with the level shifting circuit, may function as a memory circuit or cell to "hold" the state of the level shifting circuit.

In one embodiment of the first aspect, the level shifting circuit further comprises a first high voltage switching device and a second high voltage switching device operably connected with the latching circuit; wherein the first high voltage switching device and the second high voltage switching device are each arranged to receive a control signal, for selectively configuring the latching circuit to be in the set state and the reset state.

In a preferred embodiment of the first aspect, the level shifting circuit consists of the first high voltage switching device, the second high voltage switching device, and the latching circuit. In other words, the level shifting circuit is formed by these components only. The downstream high-side power switch control circuit does not need to include any other latching circuit.

In one embodiment of the first aspect, the first high voltage switching device and the second high voltage switching device are high voltage semiconductor switches. Preferably, the first high voltage switching device and the second high voltage switching device are high voltage LDMOS each arranged to receive a control signal at its gate terminal.

Preferably, the latching circuit comprises one or more of: a logic circuit; at least two back-to-back connected inverters or switching devices; one or more edge-triggered flip-flops; and any of the above combination thereof.

In one embodiment of the first aspect, the latching circuit comprises: a first inverter operably connected with the first high voltage switching device and arranged to be powered by a high-side voltage supply; and a second inverter operably connected with the second high voltage switching device and arranged to be powered by the high-side voltage supply; the first inverter and the second inverter are connected such that at least one of: an input terminal of the first inverter is connected to an output terminal of the second inverter and an input terminal of the second inverter is connected to an output terminal of the first inverter.

In one embodiment of the first aspect, one or both of the output terminal of the first inverter and the output terminal of the second inverter are arranged to be used as output to a regulation circuit for controlling the high-side power switch.

In one embodiment of the first aspect, the latching circuit further comprises a comparator connected with output terminal of the first inverter and output terminal of the second inverter for providing an output to a regulation circuit for controlling the high-side power switch.

In one embodiment of the first aspect, the latching circuit comprises: a third semiconductor switch operably connected with the first high voltage switching device and the second high voltage switching device; a fourth semiconductor switch operably connected with the first high voltage switching device and the second high voltage switching device; wherein the third semiconductor switch and the fourth semiconductor switch are connected such that a gate terminal of the third semiconductor switch is connected with a drain terminal of the fourth semiconductor switch; a gate terminal of the fourth semiconductor switch is connected with a drain terminal of the third semiconductor switch; and source terminal of the third semiconductor switch and source terminal of the fourth semiconductor switch are connected with each other.

In one embodiment of the first aspect, one or both of the drain terminal of the third semiconductor switch and the drain terminal of the fourth semiconductor switch are arranged to be used as output to a regulation circuit for controlling the high-side power switch.

In one embodiment of the first aspect, the source terminals of the third semiconductor switch and fourth semiconductor switch are connected to a high-side floating voltage.

In one embodiment of the first aspect, the latching circuit further comprises: a first resistor connected between the drain terminal of the third semiconductor switch and the high-side voltage supply; and a second resistor connected between the drain terminal of the fourth semiconductor switch and the high-side voltage supply.

In one embodiment of the first aspect, the latching circuit further comprises: a fifth semiconductor switch operably connected with the first high voltage switching device and the second high voltage switching device; a sixth semiconductor switch operably connected with the first high voltage switching device and the second high voltage switching device; wherein the fifth semiconductor switch and the sixth semiconductor switch are connected such that a gate terminal of the fifth semiconductor switch is connected with a drain terminal of the sixth semiconductor switch; a gate terminal of the sixth semiconductor switch is connected with a drain terminal of the fifth semiconductor switch; and source terminal of the fifth semiconductor switch and source terminal of the sixth semiconductor switch are connected with each other; wherein the gate terminals of the fifth semiconductor switch and the sixth semiconductor switch are connected to the high-side voltage supply; and wherein the gate terminal of the fifth semiconductor switch is connected with the gate terminal of the third semiconductor switch and the gate terminal of the sixth semiconductor switch is connected with the gate terminal of the fourth semiconductor switch.

In one embodiment of the first aspect, the source terminals of the third semiconductor switch and fourth semiconductor switch are connected to a high-side voltage supply.

In one embodiment of the first aspect, the latching circuit further comprises: a third resistor connected between the drain terminal of the third semiconductor switch and the high-side floating voltage; and a fourth resistor connected between the drain terminal of the fourth semiconductor switch and the high-side floating voltage.

In accordance with a second aspect of the invention, there is provided a half-bridge driver circuit comprising the circuit in accordance with the first aspect.

In accordance with a third aspect of the invention, there is provided integrated circuit comprising the circuit in accordance with the first aspect.

BRIEF DESCRIPTION OF THE DRAWINGS

Embodiments of the invention will now be described, by way of example, with reference to the accompanying drawings in which:

FIG. 4 is a plot showing the switching waveforms for the high-side control circuit of FIG. 3;

DETAILED DESCRIPTION OF THE PREFERRED EMBODIMENT

Figure 1:
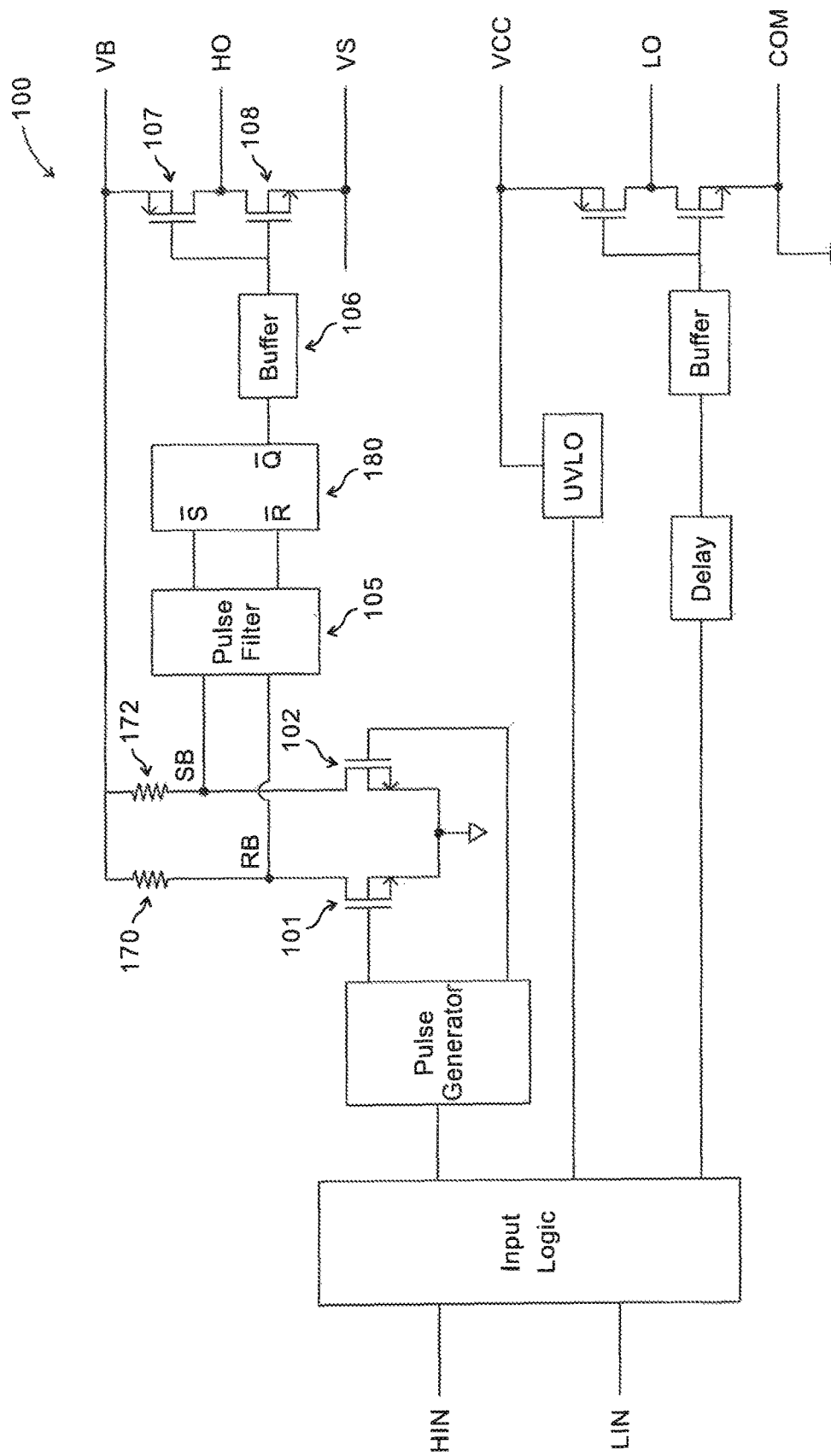
FIG. 1 is a schematic circuit diagram of a conventional half-bridge driver circuit.
Figure 2:
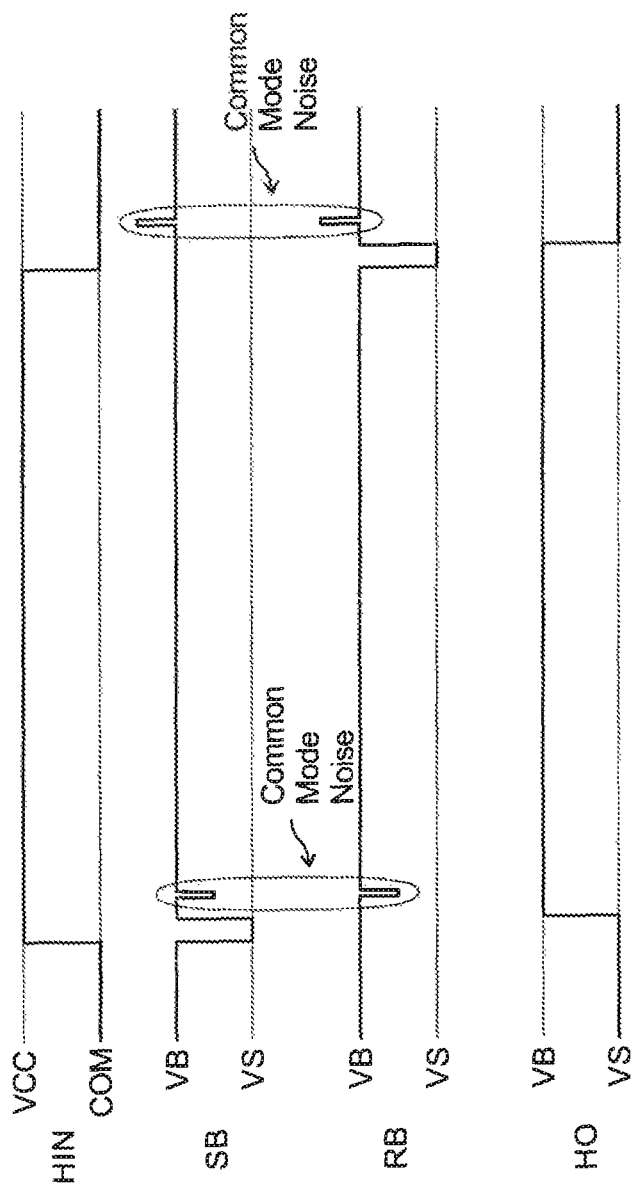
FIG. 2 is a plot showing the switching waveforms for the high-side circuit of the conventional half-bridge driver circuit of FIG. 1.
Figure 3:
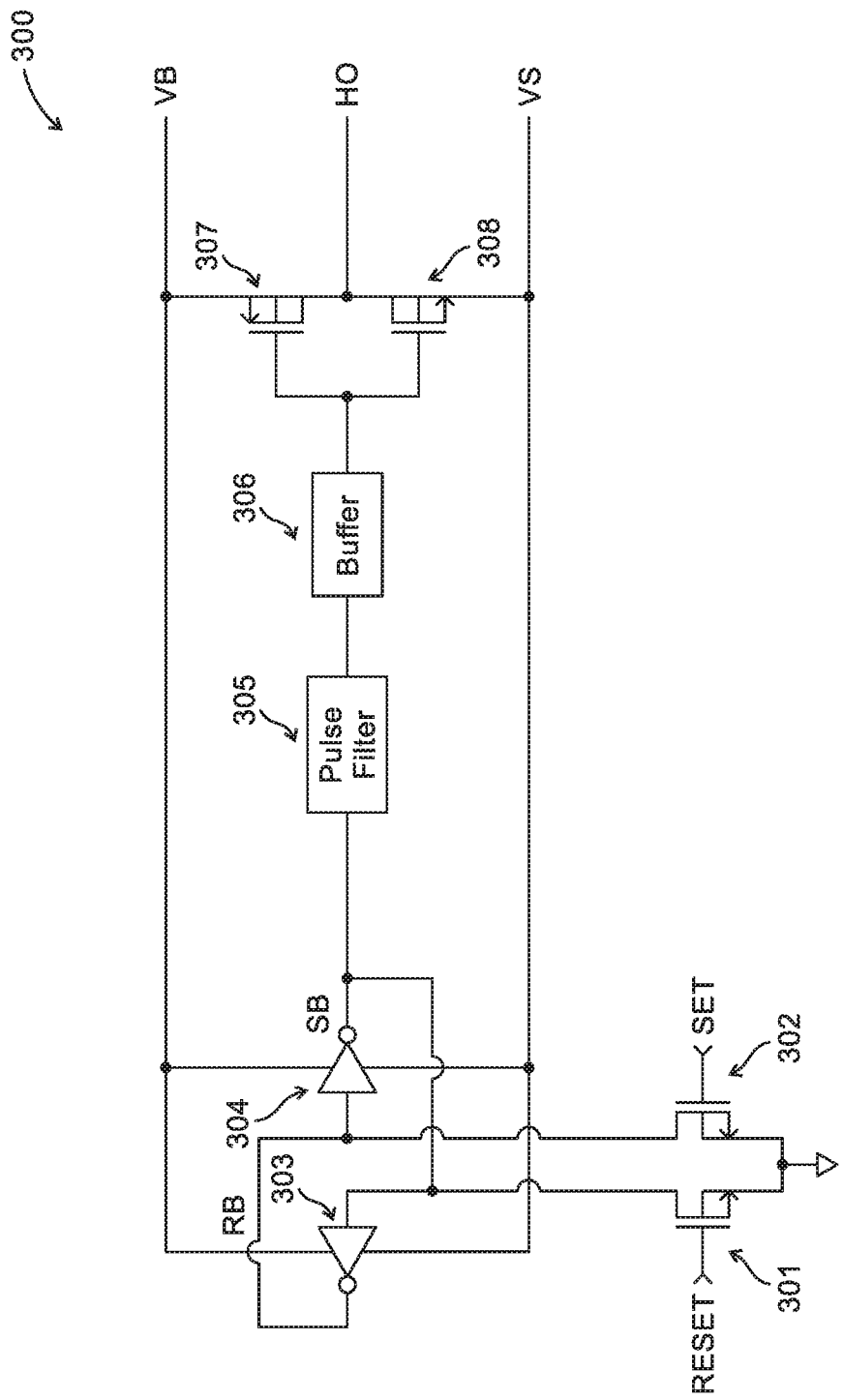
FIG. 3 is a schematic circuit diagram of a high-side control circuit with a level shifting circuit in one embodiment of the invention.

FIG. 3 shows a simplified high-side control circuit 300 in one embodiment of the invention. The circuit 300 can be arranged to replace the conventional high-side control circuit (the circuit portion connected downstream of the pulse generator) in the circuit of FIG. 1. As shown in FIG. 3, the circuit 300 includes a level shifting circuit with two high voltage LDMOS devices 301, 302 and an integrated latching circuit formed by back-to-back connected inverters 303, 304. In this embodiment, the two high voltage LDMOS devices 301 and 302 have the same device size. Each of the high voltage LDMOS devices 301, 302 is arranged to receive, at the gate terminal, a control signal from a pulse generator (not shown). Source terminals of the high voltage LDMOS devices 301 and 302 are connected together and to COM. The high voltage LDMOS devices 301, 302 are connected with the latching circuit. More specifically, a drain terminal of the high voltage LDMOS device 301 is connected to an input terminal of the inverter 303; a drain terminal of the high voltage LDMOS device 302 is connected to an input terminal of the inverter 304. An input terminal of the first inverter 303 is connected to an output terminal of the second inverter 304, and an input terminal of the second inverter 304 is connected to an output terminal of the first inverter 303. A node SB is arranged at the output of the inverter 304; a node RB is arranged at the output of the inverter 303. Both inverters 303, 304 are powered by the high-side voltage supply VB. In this embodiment, output at node SB is used as output to be provided to a regulation circuit for controlling the high-side power switch. The regulation circuit includes a pulse filter 305, a buffer 306, and a high-side driver circuit formed by two switches 307, 308. The drain terminals of the switches 307, 308 are connected with the high-side output HO. A high-side power switch (not shown) is arranged to be connected at the high-side output HO.

In the embodiment of FIG. 3, the latching circuit can, based on the control signals provided by the high voltage LDMOS devices 301, 302, be selectively configured to be in a set state for providing a first output signal to the high-side power switch and in a reset state for providing a second output signal different from the first output signal to the high-side power switch. In operation, the nodes SB and RB are at opposite potentials (i.e. one node at VB and the other node at VS, and vice versa) at substantially all times so, common mode noises can be inherently rejected. The circuit 300 is simple and has improved noise immunity. Also, there is no need for the regulation circuit to include any other latching circuit.

FIG. 4 shows the switching waveforms for the high-side control circuit 300 of FIG. 3. As shown in FIG. 4, as the high-side input HIN changes from COM to VCC, voltage at node SB drops from VB to VS, voltage at node RB rises from VS to VB, and the high-side output HO changes from VS to VB. As the high-side input HIN changes from VCC to COM, voltage at node SB rises from VS to VB, voltage at node RB drops from VB to VS, and the high-side output HO changes from VB to VS. Common mode noises are not observed at nodes SB and RB during the entire cycle. Also, the signals at the nodes SB and RB have relatively clean edge transitions compared with the conventional level shifter circuit in FIG. 1 (which makes possible the removal of a pulse filter 305 in some examples).

It should be noted that various modifications can be made to the circuit 300 in FIG. 3 to provide other embodiments of the invention. For example, the high voltage LDMOS devices 301, 302 may be replaced with other high voltage switching devices or semiconductor switches. The switches 301, 302 may be of different device sizes. The latching circuit may instead be implemented by a logic circuit, back-to-back connected inverters or switching devices, edge-triggered flip-flops, or their combination. One or both output terminals of the inverters 303, 304 can be used as output to a regulation circuit for controlling the high-side power switch. For example, output at node RB can be used as output to be provided to a regulation circuit for controlling the high-side power switch (in this case the buffer 306 has to be changed to an inverting buffer). In some examples, the pulse filter can be omitted.

Figure 5A:
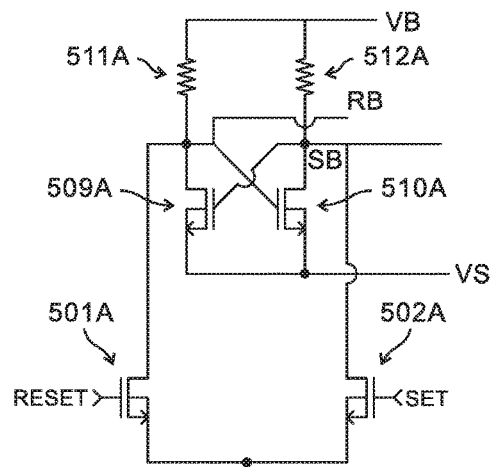
FIG. 5A is a circuit diagram of a level shifting circuit in another embodiment of the invention.

FIG. 5A shows a level shifting circuit in another embodiment of the invention that can be used in place of the level shifting circuit in FIG. 3. As shown in FIG. 5A, the level shifting circuit includes two high voltage LDMOS devices 501A, 502A and an integrated latching circuit formed by a pair of medium voltage LDMOS devices 509A, 510A and a pair of resistors 511A, 512A. The two medium voltage LDMOS devices 509A, 510A may have the same device size but this is not essential. The high voltage LDMOS devices 501A, 502A may be the same as the high voltage LDMOS devices 301, 302 in FIG. 3. Each of the high voltage LDMOS devices 501A, 502A is arranged to receive, at the gate terminal, a control signal from a pulse generator (not shown). The high voltage LDMOS devices 501A, 502A are connected with the latching circuit. More specifically, a drain terminal of the high voltage LDMOS device 501A is connected to a drain terminal of the medium voltage LDMOS device 509A; a drain terminal of the high voltage LDMOS device 502A is connected to a drain terminal of the medium voltage LDMOS device 510A. A gate terminal of the medium voltage LDMOS device 509A is connected with a drain terminal of the medium voltage LDMOS devices 510A; a gate terminal of the medium voltage LDMOS device 510A is connected with a drain terminal of the medium voltage LDMOS device 509A. Source terminals of the medium voltage LDMOS devices 509A, 510A are connected together and to the high-side floating voltage VS. A resistor 511A is connected between the high-side voltage source VB and the drain terminal of the medium voltage LDMOS devices 509A. A resistor 512A is connected between the high-side voltage source VB and the drain terminal of the medium voltage LDMOS devices 510A. A node SB is arranged at the gate terminal of the medium voltage LDMOS device 509A; a node RB is arranged at the gate terminal of the medium voltage LDMOS device 510A. Output at node SB, node RB, or both can be used as output to be provided to a regulation circuit for controlling the high-side power switch. The regulation circuit may be the one as shown and described with respect to FIG. 3.

Figure 5B:
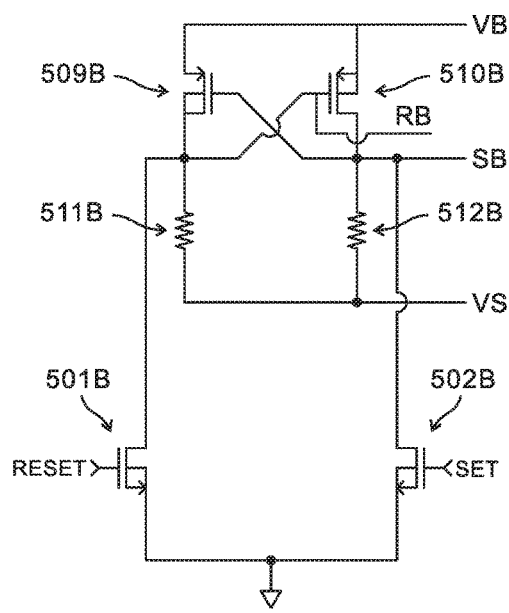
FIG. 5B is a circuit diagram of a level shifting circuit in yet another to embodiment of the invention.

FIG. 5B shows a level shifting circuit in another embodiment of the invention that can be used in place of the level shifting circuit in FIG. 3. As shown in FIG. 5B, the level shifting circuit includes two high voltage LDMOS devices 501B, 502B and an integrated latching circuit formed by a pair of medium voltage LDMOS devices 509B, 510B and a pair of resistors 511B, 512B. The two medium voltage LDMOS devices 509B, 510B may have the same device size but this is not essential. The high voltage LDMOS devices 501B, 502B may be the same as the high voltage LDMOS devices 301, 302 in FIG. 3. Each of the high voltage LDMOS devices 501B, 502B is arranged to receive, at the gate terminal, a control signal from a pulse generator (not shown). The high voltage LDMOS devices 501B, 502B are connected with the latching circuit. More specifically, a drain terminal of the high voltage LDMOS device 501B is connected to a drain terminal of the medium voltage LDMOS device 509B; a drain terminal of the high voltage LDMOS device 502B is connected to a drain terminal of the medium voltage LDMOS device 510B. A gate terminal of the medium voltage LDMOS device 509B is connected with a drain terminal of the medium voltage LDMOS devices 510B, a gate terminal of the medium voltage LDMOS devices 510B is connected with a drain terminal of the medium voltage LDMOS device 509B. Source terminals of the medium voltage LDMOS devices 509B, 510B are connected together and to the high-side voltage supply VB. A resistor 511B is connected between the high-side floating voltage VS and the drain terminal of the medium voltage LDMOS devices 509B. A resistor 512B is connected between the high-side floating voltage VS and the drain terminal of the medium voltage LDMOS devices 510B. A node SB is arranged at the gate terminal of the medium voltage LDMOS device 509B; a node RB is arranged at the gate terminal of the medium voltage LDMOS device 510B. Output at node SB, node RB, or both can be used as output to be provided to a regulation circuit for controlling the high-side power switch. The regulation circuit may be the one as shown and described with respect to FIG. 3.

Figure 5C:
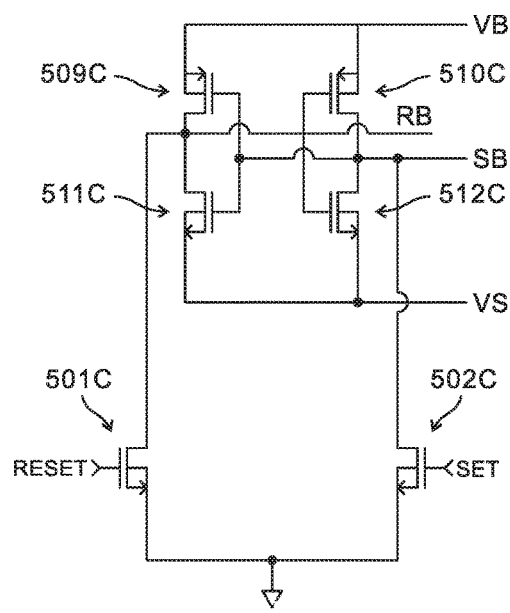
FIG. 5C is a circuit diagram of a level shifting circuit in one other embodiment of the invention.

FIG. 5C shows a level shifting circuit in another embodiment of the invention that can be used in place of the level shifting circuit in FIG. 3. As shown in FIG. 5C, the level shifting circuit includes two high voltage LDMOS devices 501C, 502C and an integrated latching circuit formed by two pairs of medium voltage LDMOS devices 509C, 510C, 511C, 512C. The medium voltage LDMOS devices 509C, 510C, 511C, 512C may have the same device size but this is not essential. The high voltage LDMOS devices 501C, 502C may be the same as the high voltage LDMOS devices 301, 302 in FIG. 3. Each of the high voltage LDMOS devices 501C, 502C is arranged to receive, at the gate terminal, a control signal from a pulse generator (not shown). The high voltage LDMOS devices 501C, 502C are connected with the latching circuit. More specifically, a drain terminal of the high voltage LDMOS device 501C is connected to a drain terminal of the medium voltage LDMOS device 509C and a drain terminal of the medium voltage LDMOS device 511C; a drain terminal of the high voltage LDMOS device 502C is connected to a drain terminal of the medium voltage LDMOS device 510C and a drain terminal of the medium voltage LDMOS device 512C. Drain terminals of the medium voltage LDMOS devices 509C, 511C are connected with each other; drain terminals of the medium voltage LDMOS devices 510C, 512C are connected with each other. Gate terminals of the medium voltage LDMOS devices 509C, 511C are connected with each other and with drain terminals of the medium voltage LDMOS devices 510C, 512C; gate terminals of the medium voltage LDMOS devices 510C, 512C are connected with each other and with drain terminals of the medium voltage LDMOS devices 509C, 511C. Source terminals of the medium voltage LDMOS devices 509C, 510C are connected together and to the high-side voltage supply VB. Source terminals of the medium voltage LDMOS devices 511C, 512C are connected together and to the high-side floating voltage VS. A node SB is arranged at the gate terminals of the medium voltage LDMOS devices 509C, 511C; a node RB is arranged at the gate terminals of the medium voltage LDMOS devices 510C, 512C. Output at node SB, node RB, or both can be used as output to be provided to a regulation circuit for controlling the high-side power switch. The regulation circuit may be the one as shown and described with respect to FIG. 3.

In the embodiment of FIGS. 5A-5C, the latching circuit can, based on the control signals provided by the high voltage LDMOS devices 501A, 502A, 501B, 502B, 501C 502C, be selectively configured to be in a set state for providing a first output signal to the high-side power switch and in a reset state for providing a second output signal different from the first output signal to the high-side power switch. In operation, the nodes SB and RB nodes are at opposite voltage potentials (i.e. one node at VB and the other node at VS, and vice versa) at substantially all times so, common mode noises can be inherently rejected. No further latching circuit is necessary in the regulation circuit.

It should be noted that various modification can be made to the latching circuit in FIGS. 5A-5C to provide other embodiments of the invention. For example, the high voltage LDMOS devices 501A, 502A, 501B, 502B, 501C 502C may be replaced with other high voltage switching devices or semiconductor switches. The medium voltage LDMOS devices 509A, 510A, 509B, 510B, 509C, 510C, 511C, 512C may be replaced with other medium voltage switching devices or semiconductor switches. The switches 509A, 510A, 509B, 510B, 509C, 510C, 511C, 512C may be of different device sizes. Output of one or both of nodes SB and RB can be used as output to a regulation circuit for controlling the high-side power switch. In some examples, the pulse filter can be omitted.

Figure 6:
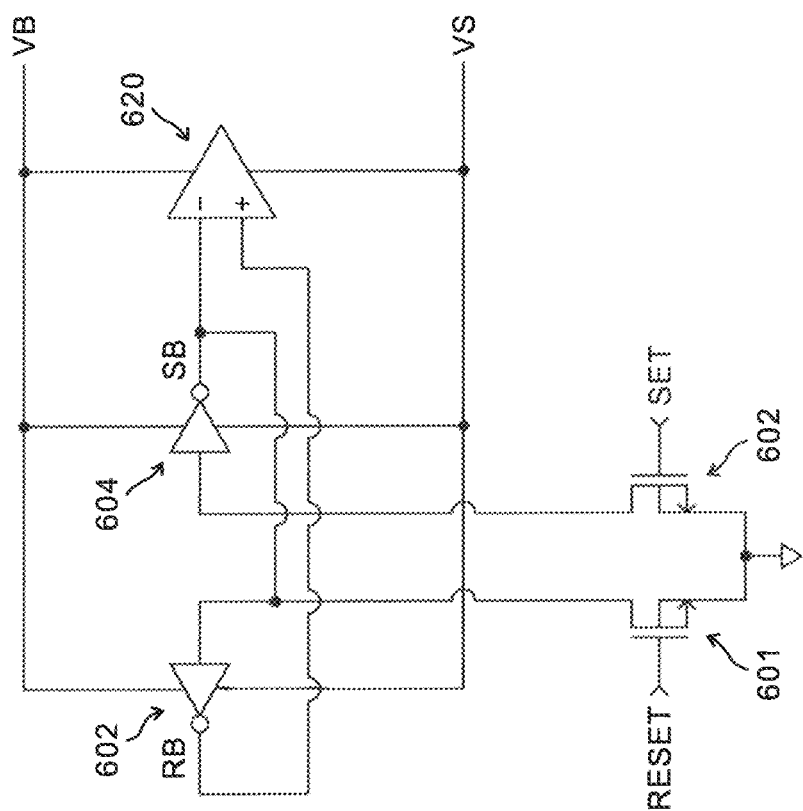
FIG. 6 is a circuit diagram of a level shifting circuit in an alternative embodiment of the invention.

FIG. 6 shows a level shifting circuit in another embodiment of the invention that can be used in place of the level shifting circuit in FIG. 3. The level shifting circuit in FIG. 6 includes two high voltage LDMOS devices 601, 602 and an integrated latching circuit formed by inverters 603, 604 and comparator 620. Both inverters 603, 604 and the comparator 620 are powered by the high-side voltage supply VB. In this embodiment, the two high voltage LDMOS devices 601, 602 have the same device size. Each of the high voltage LDMOS devices 601, 602 is arranged to receive, at the gate terminal, a control signal from a pulse generator (not shown). Source terminals of the high voltage LDMOS devices 601, 602 are connected together and to COM. The high voltage LDMOS devices 601, 602 are connected with the latching circuit. More specifically, a drain terminal of the high voltage LDMOS device 601 is connected to an input terminal of the inverter 603 and an output terminal of the inverter 604; a drain terminal of the high voltage LDMOS device 602 is connected to an input terminal of the inverter 604. An input terminal of the first inverter 603 is connected to an output terminal of the second inverter 604. A node SB is arranged at the output of the inverter 604; a node RB is arranged at the output of the inverter 603. Outputs at node SB and node RB are provided to the comparator 620, which, based on these outputs, provide an output to the regulation circuit for controlling the high-side power switch.

Unlike the previous embodiments which take outputs at nodes SB and/or RB as the output to the regulation circuit for controlling the high-side power switch, in the embodiment of FIG. 6, the comparator 620 can be used to process outputs at nodes SB and RB to provide output to the regulation circuit. The comparator 620 performs similar function as a pulse filter to eliminate potential noise at nodes SB and RB during state transition. Further downstream pulse filter may be omitted.

It should be noted that various modification can be made to the latching circuit in FIG. 6 to provide other embodiments of the invention. For example, the high voltage LDMOS devices 601, 602 may be replaced with other high voltage switching devices or semiconductor switches. The switches 601, 602 may be of different device sizes.

Whilst the accompanying drawings illustrated specific circuits falling within the scope of the invention, it will be understood that a number of modifications or alternations may be made thereto without departing from the scope of the invention as defined by the appended claims.

The invention claimed is:

1. A half-bridge driver circuit comprising:
   a low-side circuit providing a low-side output to drive a low-side power switch, wherein the low-side output is a changeable voltage which is changeable within a low-side voltage range; and
   a high-side circuit providing a high-side output to drive a high-side power switch, wherein
      the high-side output is a changeable voltage which is changeable within a high-side voltage range, and the high-side voltage range is larger than the low-side voltage range,
      the high-side circuit comprises
         a level shifting circuit comprising a first switching device and a second switching device,
         a single latching circuit configured to reject common mode noise and comprising
            a first inverter operatively connected to the first switching device and powered by a high-side voltage supply, and
            a second inverter operatively connected to the second switching device and powered by the high-side voltage supply, wherein
            the first switching device and the second switching device receive respective control signals for selectively configuring the latching circuit to be in a set state, for providing a first output signal to the high-side power switch, and in a reset state, for providing a second output signal, different from the first output signal, to the high-side power switch, the single latching circuit selectively holds the set state or the reset state, and at least one of
(i) an input terminal of the first inverter is directly connected to an output terminal of the second inverter, and
(ii) an input terminal of the second inverter is directly connected to an output terminal of the first inverter, a high-side driver circuit operatively connected to the single latching circuit and including two switches having respective drain terminals and a high-side output terminal connected to the drain terminals of the two switches, and a regulation circuit operatively connected to the single latching circuit and to the high-side driver circuit to control the high-side power switch, wherein the latching circuit further comprises a comparator connected to the output terminal of the first inverter and the output terminal of the second inverter for providing an output to the regulation circuit.

2. The half-bridge driver circuit of claim 1, wherein the level shifting circuit consists of the first switching device and the second switching device.

3. The half-bridge driver circuit of claim 1, wherein the first switching device and the second switching device are semiconductor switches.

4. The circuit of claim 3, wherein
the first switching device is a first LDMOS device having a gate terminal,
the second switching device is a second LDMOS device having a gate terminal, and
each of the first and second LDMOS devices receives a respective control signal at the respective gate=terminal.

5. The circuit of claimer 1, wherein at least one of the output terminal of the first inverter and the output terminal of the second inverter provides an output to the regulation circuit.

6. An integrated circuit comprising the half-bridge driver circuit in accordance with claim 1.

7. The half-bridge driver circuit of claim 1, wherein
the input terminal of the first inverter is directly connected to the output terminal of the second inverter, and
the input terminal of the second inverter is directly connected to the output terminal of the first inverter.

8. The half-bridge driver circuit of claim 1, wherein the regulation circuit comprises a buffer.

9. The half-bridge driver circuit of claim 8, wherein the regulation circuit further comprises a pulse filter.

10. The half-bridge driver circuit of claim 1, wherein
the two switches of the high-side driver circuit comprise respective gate terminals, and
the gate terminals of the two switches are connected to the regulation circuit.

11. The half-bridge driver circuit of claim 4, wherein
each of the first and second LDMOS devices includes a drain terminal,
the drain terminal of the first LDMOS device is directly connected to the input terminal of the first inverter, and
the drain terminal of the second LDMOS device is directly connected to the input terminal of the second inverter.

* * * * *